(12) United States Patent
Morita et al.

(10) Patent No.: US 6,372,699 B1
(45) Date of Patent: Apr. 16, 2002

(54) CLEANING SOLUTION FOR ELECTRONIC MATERIALS AND METHOD FOR USING SAME

(75) Inventors: Hiroshi Morita, Hadano; Tetsuo Mizuniwa, Yokosuka; Junichi Ida, Koga, all of (JP)

(73) Assignee: Kurita Water Industries Ltd. (JP)

( * ) Notice: Subject to any disclaimer, the term of this patent is extended or adjusted under 35 U.S.C. 154(b) by 0 days.

(21) Appl. No.: 09/215,872

(22) Filed: Dec. 18, 1998

(30) Foreign Application Priority Data

Dec. 22, 1997 (JP) .............................. 9-353403
Jan. 27, 1998 (JP) ........................... 10-013938

(51) Int. Cl.[7] .......................... C11D 13/10; C11D 7/18; C11D 7/60
(52) U.S. Cl. ..................... 510/175; 510/165; 510/166; 510/167; 510/168
(58) Field of Search .................. 510/165, 166, 510/167, 168, 175

(56) References Cited

U.S. PATENT DOCUMENTS

| | | | | |
|---|---|---|---|---|
| 3,799,511 A | * | 3/1974 | Svantesson | 261/29 |
| 3,954,645 A | | 5/1976 | Otrhalek et al. | 252/101 |
| 4,136,023 A | * | 1/1979 | Kirk et al. | 210/8 |
| 5,409,544 A | * | 4/1995 | Ota et al. | 134/22.14 |
| 5,414,144 A | * | 5/1995 | Watanabe et al. | 568/670 |
| 5,885,362 A | * | 3/1999 | Morinaga et al. | 134/2 |
| 5,930,998 A | * | 8/1999 | Blangetti et al. | 60/646 |

FOREIGN PATENT DOCUMENTS

| | | |
|---|---|---|
| EP | 0560324 | 9/1993 |
| EP | 0789071 A | 8/1997 |
| GB | 2323850 A | 4/1998 |
| JP | 60239028 | 11/1985 |
| JP | 04107923 | 4/1992 |
| JP | 6163495 A | 6/1994 |
| JP | 6163495 A * | 6/1994 |
| JP | 07283182 | 10/1995 |
| JP | 10004074 | 1/1998 |

\* cited by examiner

Primary Examiner—Mark Kopec
Assistant Examiner—Brian P. Mruk
(74) Attorney, Agent, or Firm—Morrison Law Firm

(57) ABSTRACT

A cleaning solution for electronic materials contains dissolved oxygen gas at a concentration greater than atmospheric saturation concentration, 0.1–10,000 mg/liter of ammonia, and 0.1–10,000 mg/liter of hydrogen peroxide in water. Alternatively, the cleaning solution contains dissolved reducing agents, 0.1–10,000 mg/liter of ammonia, and 0.1–10,000 mg/liter of hydrogen peroxide in water. A method for making the cleaning solution of the present invention is provided. A method for cleaning electronic materials using the cleaning solution of the present invention is also provided.

7 Claims, 1 Drawing Sheet

CLEANING SOLUTION FOR ELECTRONIC MATERIALS AND METHOD FOR USING SAME

BACKGROUND OF THE INVENTION

The present invention relates to a cleaning solution for electronic materials. In particular, the present invention involves wet cleaning where impurities and especially particulate matter are removed from the surface of electronic materials. The cleaning solution is effective at room temperature using low concentrations of dissolved chemicals. The present invention includes a method for cleaning electronic materials.

Removing particulate matter, or particles, from the surfaces of electronic materials such as semiconductor silicon substrates, liquid crystal glass substrates, and photomask quartz substrates, is extremely important in order to prevent defective products. Traditionally, an aqueous solution of a mixture of ammonia and hydrogen peroxide is used with heat to achieve this objective. This method is called APM cleaning. The standard mixing ratio of the chemicals used in APM cleaning is a solution of aqueous ammonia (29% by weight), aqueous hydrogen peroxide (30% by weight), and water in a 1:1:5 ratio. Generally, washing takes place at a temperature of around 80° C. The APM cleaning method is extremely effective in removing particles. However, the APM method has several problems. Since a high concentration of high purity chemicals is used, a great deal of ultrapure water is needed for the rinse after cleaning. Ultrapure water has a resistivity less than 16MΩ and less than 10 µg/l total organic carbon. The high demand for ultrapure water results in excessive waste water processing. In addition, the APM method requires a mechanism for heating and temperature adjustment. This generates chemical contaminated steam, requiring an air pollution control system for removing contamination from the steam. The required local exhaust ventilation, air pollution control devices, and replacement of exhausted air with tempered fresh air, becomes very costly.

A number of methods have been investigated to overcome these disadvantages without losing the particle removal effect. For example, one method uses several-fold dilutions of the chemicals of the prior art, while the temperature is maintained at approximately 40° C., or ambient temperature. This is used in conjunction with ultrasonic vibrations. This improvement is based on the APM method of the prior art. Although this method is easily implemented, and may be adapted for use in a mass production factory, the improvement over the disadvantages indicated above is not significant.

A cleaning solution for electronic materials is sought that uses low concentrations of chemicals and is effective at room temperature.

OBJECTS AND SUMMARY OF THE INVENTION

In light of the above, it is an object of the present invention to provide a cleaning solution for electronic materials which overcomes the limitations of the prior art.

The present inventors have discovered, through intensive research, that dissolving oxygen gas at a concentration greater than atmospheric saturation concentration, into water containing a low concentration of ammonia and hydrogen peroxide, results in a cleaning solution that is extremely effective in removing particles adhering to the surface of electronics material. Atmospheric saturation concentration is the concentration of gas dissolved in water when it is in equilibrium with the atmosphere. The atmospheric saturation concentration of oxygen gas fluctuates with temperature. At low temperatures, the atmospheric saturation concentration becomes higher, and at high temperatures, it becomes lower. At 20–25° C., it is approximately 8–9 mg/liters.

It was also discovered that dissolving reducing agents into water containing low concentrations of ammonia and hydrogen peroxide results in a cleaning solution that is extremely effective in removing particles adhered to the surface of electronics material. The present invention is based on these findings.

It is an object of the present invention to provide a cleaning solution for electronic materials that removes impurities, especially particles, from the surface of electronic materials during wet cleaning, cleans effectively at room temperature, and requires only a low concentration of dissolved chemicals.

It is a further object of the present invention to provide a cleaning solution for electronic materials that conserves resources, is environmentally safe, and is easily implemented, even at mass production facilities.

It is a further object of the present invention to provide a method using such a cleaning solution that is suitable for mass production facilities.

Briefly stated, the present invention provides a cleaning solution for electronic materials which includes dissolved oxygen gas at a concentration greater than atmospheric saturation concentration, 0.1–10,000 mg/liter of ammonia and 0.1–10,000 mg/liter of hydrogen peroxide.

According to another embodiment of the present invention, a cleaning solution for electronic materials is provided including from about 0.00005 to 1 weight percent of a reducing agent, from about 0.1–10,000 mg/liter of ammonia and about 0.1–10,000 mg/liter of hydrogen peroxide.

According to an embodiment of the present invention, a method of cleaning electronic materials is provided that includes dissolving oxygen gas into a source water to a predetermined concentration in excess of atmospheric saturation concentration, adding from about 0.1 mg/liter to about 10,000 mg/liter of ammonia to the source water; and adding from about 0.1 mg/liter to about 10,000 mg/liter of hydrogen peroxide to the source water, to produce a cleaning solution.

According to another embodiment of the present invention, a method of cleaning electronic materials is provided that includes adding at least one reducing agent to a source water to a predetermined concentration from about 0.00005 to 1 weight percent, adding from about 0.1 mg/liter to about 10,000 mg/liter of ammonia to the source water, and adding from about 0.1 mg/liter to about 10,000 mg/liter of hydrogen peroxide to the source water, to produce a cleaning solution.

According to another embodiment of the present invention, a method for cleaning electronic materials includes dissolving oxygen gas in a source water at a predetermined concentration greater than atmospheric saturation concentration, adding ammonia to the source water at a predetermined concentration from about 0.1 mg/liter to about 10,000 mg/liter from an ammonia supply point, adding hydrogen peroxide to the source water at a predetermined concentration from about 0.1 mg/liter to about 10,000 mg/liter from a hydrogen peroxide supply point to form a cleaning solution, storing the cleaning solution in a storage container, measuring the flow rates of ammonia from the ammonia source point and of hydrogen peroxide from the hydrogen peroxide supply point, adjusting the flow rates of ammonia and hydrogen peroxide from the source points to maintain a constant concentration of cleaning solution in the storage container, transporting the cleaning solution to at least one use point, and cleaning the electronic materials with the cleaning solution at the at least one use point.

According to another embodiment of the present invention, a method for cleaning electronic materials includes forming a cleaning solution by adding at least one reducing agent into a source water at a predetermined concentration from about 0.00005 weight percent to about 1 weight percent, adding ammonia to the source water at a predetermined concentration from about 0.1 mg/liter to about 10,000 mg/liter from an ammonia supply point, adding hydrogen peroxide to the source water at a predetermined concentration from about 0.1 mg/liter to about 10,000 mg/liter from a hydrogen peroxide supply point to form a cleaning solution, storing the cleaning solution in a storage container, measuring the flow rates of ammonia from the ammonia source point and of hydrogen peroxide from the hydrogen peroxide supply point, adjusting the flow rates of ammonia and hydrogen peroxide from their respective source points to maintain a constant concentration of cleaning solution in the storage container, transporting the cleaning solution to at least one use point, and cleaning electronic materials with the cleaning solution at the at least one use point.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
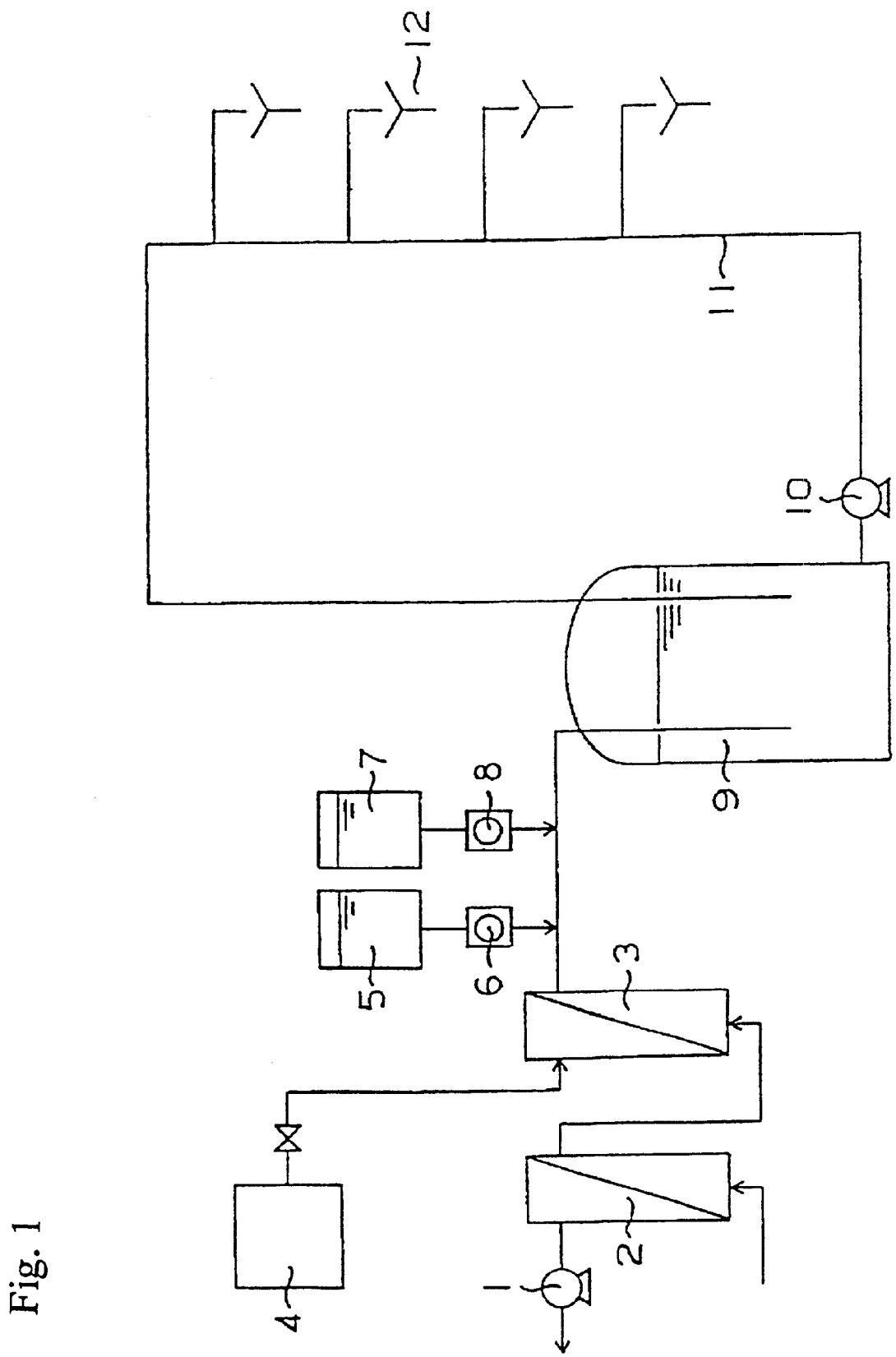
FIG. 1 is a system diagram of one embodiment of a device for making and supplying a cleaning solution for electronic materials of the present invention.

The cleaning solution for electronic materials of the present invention is effective in removing metal contamination, organic contamination, and particulate contamination. In particular, the present invention is highly effective in removal of particulate matter contamination, or particles. It can be used for washing materials, including but not limited to, semiconductor silicon substrates, liquid crystal glass substrates, and photomask quartz substrates.

There are no particular limitations on the method of manufacturing the cleaning solution of the present invention. It can be made by adding ammonia and hydrogen peroxide to water having a dissolved oxygen gas concentration greater than atmospheric saturation concentration. Alternatively, the cleaning solution can be made by dissolving oxygen gas at a higher concentration than atmospheric saturation concentration into water which already contains ammonia and hydrogen peroxide.

The method where ammonia and hydrogen peroxide is added to water already containing dissolved oxygen gas is preferred. In this method, the water is deaerated prior to dissolving oxygen gas into the water, even if the degree of saturation of the dissolved oxygen gas is lowered as a result. This method avoids the risk of ammonia changing into a gas and being lost. In addition, this method also avoids acceleration of the breakdown of hydrogen peroxide.

The preferred method for dissolving oxygen gas into water is by supplying oxygen gas to water which has been deaerated and which has a reduced degree of saturation of dissolved gases. In the present invention, the degree of saturation of gas is the amount of gas dissolved in water divided by the amount of gas dissolved at a pressure of $10^5$ Pa, and temperature of 20° C. For example, when water is in contact with nitrogen gas at a pressure of $10^5$ Pa and at a temperature of 20° C., the amount of nitrogen gas dissolved in water at equilibrium is 19.2 mg/liter. If the only gas dissolved in water is nitrogen gas, and if the amount dissolved is 19.2 mg/liter, the degree of saturation is 1.0 times. If nitrogen is the only gas dissolved in water, and if the amount of dissolved gas is 9.6 mg/liter, the degree of saturation is 0.5 times. Water in contact with air at a pressure of $10^5$ Pa and a temperature of 20° C., has a degree of saturation of 1.0 when 15.4 mg/liter of nitrogen gas and 8.8 mg/liter of oxygen gas are dissolved in the water, at equilibrium.

When the water is deaerated, the degree of saturation is 0.1 times. Then, the amount of dissolved nitrogen gas is 1.5 mg/liter, and the amount of dissolved oxygen gas is 0.9 mg/liter. When water is in contact with oxygen gas at a pressure of $10^5$ Pa and a temperature of 20° C., the amount of oxygen gas dissolved in water at equilibrium is 44.0 mg/liter. When only oxygen gas is dissolved in water and when the amount of dissolved gas is 22.0 mg/liter, the degree saturation is 0.5 times.

Generally, the higher the concentration of dissolved oxygen gas in the cleaning solution, the greater its effectiveness. In particular, the closer the dissolved oxygen gas concentration is to 44 mg/liter (the saturation concentration of oxygen gas at atmospheric pressure and room temperature), the greater the cleaning effectiveness. However, even if the dissolved oxygen gas concentration is not as high as the saturation concentration, the cleaning solution is still effective, as long as the dissolved oxygen gas exceeds a certain level. This concentration is 12 mg/liter or greater, preferably around 20 mg/liter. This is a little less than half the degree of saturation of dissolved oxygen gas at normal temperature and atmospheric pressure. If the dissolved oxygen gas concentration is around 30 mg/liter, or approximately 70% of the degree of saturation, an even better cleaning effect is achieved.

There are no particular limitations on the degree of deaeration of water in the manufacture of the cleaning solution of the present invention. However, in order to efficiently make a cleaning solution having a dissolved oxygen gas concentration of 20 mg/liter, it is preferable to deareate the amount of gas from the water equivalent to the degree of saturation of oxygen gas to be dissolved. This serves to increase the gas dissolving capacity of the water. For example, when dissolving 0.5 times or more of the saturation degree of oxygen, it is preferred to deaerate an amount of dissolved gas which is equivalent to 0.5 times or more of the saturation degree of oxygen. The deaeration amount of the dissolved gas in the source water can be calculated in terms of a degree of saturation. The amount of oxygen gas which is to be dissolved can also be calculated in terms of a degree of saturation. When the amount of dearation is approximately equal to the amount of oxygen gas to be dissolved, then oxygen gas can be readily dissolved in water.

Water in equilibrium with the atmosphere has approximately 8 mg/liter of dissolved oxygen gas, approximately 16 mg/liter of dissolved nitrogen gas, and trace amounts of dissolved carbon dioxide. When using this water as the source water, if the dissolved nitrogen gas concentration is reduced to approximately 8 mg/liter or lower, or in other words, the degree of saturation is reduced to approximately 0.5 or lower, oxygen gas can be readily dissolved to a degree of saturation of approximately 0.5. In this way, a cleaning solution with a dissolved oxygen gas concentration of 20 mg/liter or greater can be readily obtained.

In the method of the present invention, the source water does not necessarily have to be at equilibrium with the atmosphere. There are no limitations on the type of dissolved gases or in their concentration ratios. For example, the dissolved gas can be substituted with almost exclusively nitrogen gas, resulting in a source water with a heightened dissolved nitrogen gas concentration. In this case, if deaeration is conducted so that the amount of gas equivalent to the required degree of saturation is removed, the objective can be achieved. The total reduction in the amount of dissolved gas is converted to a degree of saturation. This amount should be an amount which counterbalances or exceeds the degree of saturation of oxygen gas which is to be dissolved.

For the deaeration process for making the cleaning solution of the present invention, methods such as vacuum deaeration or vacuum membrane deaeration are preferred. Among these methods, membrane deaeration by a high purity deaeration membrane module is preferred. It can deaerate trace amounts of dissolved gas at locations comparatively close to the points of use without spoiling the purity of the source water.

There are no particular limitations as to the method of dissolving oxygen gas in water. For example, dissolving oxygen in water without deaerating it can be accomplished based on Henry's law. By bubbling high concentration oxygen gas through the water, the dissolved nitrogen gas in the water is reduced, and a dissolved oxygen gas concentration of 30 mg/liter or greater can be achieved. This method requires a great deal of oxygen gas in order to increase the dissolved oxygen gas concentration to a constant concentration. However, it is easy, using this method, to produce water which contains a high concentration of dissolved oxygen gas while requiring no special devices.

It is preferred that the oxygen gas be bubbled after removing dissolved gases from the water. There are no particular limitations in the method of removing dissolved gases. For example, water can be passed through a deaerating membrane device, or water can be passed through a packed column which is maintained at a reduced pressure. Less oxygen gas is needed to increase the dissolved oxygen gas to a constant concentration by bubbling oxygen gas after removing any dissolved gases from the water, as compared to the method where the water is not first deaerated.

The oxygen gas concentration in water can be increased by using a gas permeable membrane module. For example, by using oxygen gas as the sweep gas, and aerating the gas phase of the gas permeable membrane module, a dissolved oxygen gas concentration of 30 mg/liter or greater can be achieved. In water at equilibrium with the atmosphere, most of the dissolved gas, other than oxygen gas, is nitrogen. If the partial pressure of oxygen gas in the gas phase of the gas permeable membrane module is increased, substitution of dissolved nitrogen gas results. Thus, the dissolved nitrogen gas concentration is reduced, and the dissolved oxygen gas concentration is increased. In this method using oxygen gas as the sweep gas, some excess oxygen gas is necessary. However, the dissolved oxygen gas concentration can be readily increased using a simple device.

In addition, gas permeable membrane modules can be used in multiple stages to remove dissolved gas and to dissolve oxygen gas. For example, the gas permeable membrane module can be set up in 2 stages. The first stage gas permeable membrane module is used to conduct vacuum membrane deaeration of the total dissolved gases, and the latter stage gas permeable membrane module is used to dissolve oxygen gas. Using this system, oxygen gas is not released excessively. Further, using this method, it is possible to dissolve oxygen at an approximately fixed concentration.

When using gas permeable membrane modules in two stages, with the first stage gas permeable membrane module conducts vacuum membrane deaeration of the total dissolved gases, oxygen gas can be present in the vacuum gas phase of the first stage gas permeable membrane module. By doing this, the amount of oxygen gas used is slightly increased. However, the removal efficiency of nitrogen gas in the first stage gas permeable membrane module is improved. At the same time, oxygen gas is dissolved to some degree in the water.

An appropriate method of dissolving oxygen gas can be selected according to the dissolved oxygen gas concentration required or according to amount of usage of the cleaning solution.

There are no particular limitations on the reducing agent to be used in the cleaning solution. Examples include: reducing gases, such as hydrogen gas; hyposulfites, such as sodium hyposulfite ($Na_2S_2O_4$) and ammonium hyposulfite; sulfites, such as sodium sulfite ($Na_2SO_3$) and ammonium sulfite; hydrogen sulfites, such as sodium hydrogen sulfite (NaHSO3) and ammonium hydrogen sulfite; nitrites, such as sodium nitrite ($NaNO_2$) or ammonium nitrite; hydrazine; inorganic reducing agents such as hydrogen sulfide; or organic reducing agents, such as formic acid and aldehyde. These reducing agents can be used alone, or in combination. Preferably, the reducing agent to be used is a high purity reagent.

The concentration of the reducing agent is preferably between 0.00005–1 weight %, and more preferably between 0.05–0.5 weight %. If the concentration of reducing agent is less than 0.00005 weight %, the cleaning effectiveness may be inadequate. An adequate cleaning effect is shown with a concentration of 1 weight % or less. Normally, there is no need for the concentration of reducing agents to exceed 1 weight %. If the concentration of reducing agents is too high, an excessive amount of water for rinsing after cleaning may become necessary. If the reducing agent is hydrogen gas, the concentration is preferably 0.5–1.5 mg/liter.

There are no particular limitations on the method of making the cleaning solution of the present invention which includes reducing agents. It can be made by adding ammonia and hydrogen peroxide to water in which the reducing agent is already dissolved. Alternatively, it can be made by dissolving reducing agents into water already containing ammonia and hydrogen peroxide. It is also possible to make the cleaning solution by mixing aqueous solutions of reducing agents, ammonia and hydrogen peroxide.

The content of ammonia is 0. 1–10,000 mg/liter, and preferably 1–100 mg/liter. The cleaning solution is alkaline due to the presence of ammonia. As a result, the particles and the surface of the object to be cleaned both become negatively charged. This prevents the particles from re-adhering to the surface of the object to be cleaned. If the content of ammonia is less than 0.1 mg/liter, the cleaning effectiveness may be inadequate. An adequate cleaning effect is shown with an ammonia content of 10,000 mg/liter or less. Normally, an ammonia content exceeding 10,000 mg/liter is not necessary. If the ammonia content is too high, the amount of water required for rinsing after cleaning may have to be increased.

The content of hydrogen peroxide is 0.1–10,000 mg/liter, and preferably 1–100 mg/liter. The presence of hydrogen peroxide in the cleaning solution results in an oxidation stability greater than when only dissolved oxygen gas is used. In addition, roughening of the surface of the object to be cleaned is prevented. If the hydrogen peroxide content is less than 0.1 mg/liter, the cleaning effectiveness may not be adequate. A hydrogen peroxide content of 10,000 mg/liter or less results in an adequate cleaning effect. Normally, a hydrogen peroxide content exceeding 10,000 mg/liter is not necessary. If the hydrogen peroxide content is too high, an excessive amount of water is required for rinsing after cleaning.

There are no particular limitations for the method of contact between the cleaning solution of present invention and the electronic material, especially for an electronic material which is contaminated by particles. An appropriate method can be selected according to the type of particle, particle size, and amount of deposition. For example, an electronic material that has been contaminated by particles can be submerged in cleaning solution and batch cleaned. Alternatively, a sheet cleaning method where one sheet is processed at a time can also be used. An example of a sheet cleaning method include a spin cleaning method in which cleaning solution is poured while the electronic material contaminated with particles is rotated.

When cleaning electronic material contaminated with particles using the cleaning solution of present invention, ultrasonic vibrations can be transmitted to the electronic material cleaning solution. There are no particular limitations as to the method of transmitting ultrasonic vibrations to the electronic material cleaning solution. For example, in batch cleaning, ultrasonic vibrations can be transmitted to the vat where the cleaning solution is stored. In spin cleaning, ultrasonic vibrations can be transmitted by the nozzle piece from which the cleaning solution is to be poured. The frequency of the ultrasonic vibration to be transmitted for the present invention is preferably 20 kHz or greater, and is more preferably 400 kHz or greater. If the frequency of the ultrasonic vibration is less than 20 kHz, the removal of particles from electronic materials contaminated with particles may be inadequate. In order to conduct precision cleaning without damaging the surface of the object to be cleaned, an ultrasonic vibration of particularly high frequency of 400 kHz or greater is preferably transmitted. For the present invention, a frequency of 400 kHz is more preferred, and a frequency greater than 1 MHz is most preferred. When vibrations are at several tens of kHz, as in the prior art, removal of particles from electronic materials contaminated with particles may be inadequate. Furthermore, because of the cavitation effect of ultrasonic vibrations, there may be damage to the object being cleaned.

The cleaning solution of the present invention is extremely effective in particle removal at room temperature. Since the surface can be cleaned at a high particle removal rate, it is not necessary to heat to high temperatures as in the APM cleaning of the prior art. As a result, by using the cleaning solution of the present invention, energy costs can be reduced, and the working environment is improved.

The cleaning solution of the present invention can be used by transporting the cleaning solution to use points from a closed cleaning solution storage tank via pipes and returning excess cleaning solution to the closed cleaning solution storage tank via pipes, using a device for circulating the cleaning solution. Referring to FIG. 1, a system diagram of one mode of the supply device for the cleaning solution of the present invention is shown. The source water is sent to the first stage gas permeable membrane module 2 in which the gas phase side is maintained as a vacuum by a vacuum pump 1. Dissolved gas is removed from the source water. The deaerated water is then sent to the latter stage gas permeable membrane module 3. Oxygen gas supplied by an oxygen gas supply device 4 is then dissolved into the water until a specified concentration is reached. The oxygen is dissolved in the water at a higher concentration than atmospheric saturation concentration. Next, the cleaning solution is prepared by adding ammonia to this oxygenated water, by a pump 6 from an ammonia water storage tank 5. In addition, hydrogen peroxide solution is added by a pump 8 from a hydrogen peroxide solution storage tank 7. The cleaning solution is stored in a closed cleaning solution storage tank 9. The inflow volume of the deaerated and oxygenated water, the concentration of ammonia, and the concentration of hydrogen peroxide in the cleaning solution inside the storage tank is measured. A signal is sent to the controller, and the flow volume of ammonia solution and hydrogen peroxide solution is controlled by pump 6 and pump 8, respectively. In this manner, it is possible to maintain the ammonia and hydrogen peroxide concentration of the cleaning solution inside the storage tank at a constant value.

The cleaning solution stored in closed cleaning solution storage tank 9 is sent by a pump 10 to an use point 12 via a pipe 11. Excess cleaning solution that is not used at the use point is returned to the closed cleaning solution storage tank via pipes, to be circulated and reused.

In the cleaning solution of the present invention, having dissolved oxygen gas and a low concentration of ammonia and hydrogen peroxide, the oxygen gas does not autolyse and is extremely stable. Because the ammonia and hydrogen peroxide is at a low concentration, and because a closed storage tank and supply pipes are used, the water quality can be maintained for extended periods. By using such a device, individual cleaning solution production devices do not have to be placed at each use point. The cleaning solution can be produced centrally, and through main pipes and branching pipes, cleaning solution having a stable water quality can be supplied to a plurality of use points. In addition, a circulating system can be used that returns excess cleaning solution that is not used at the use point to the storage tank, repeatedly sends cleaning solution to use points.

Using the cleaning solution of the present invention greatly reduces the amount of chemicals used in cleaning of electronic materials contaminated by particles. Extremely effective cleaning at room temperature is achieved. In addition, the waste water processing after cleaning of the electronic material is easy. In the cleaning process of the prior art, a waste water containing high concentrations of ammonia and hydrogen peroxide is discharged. As a result, neutralization processing or breakdown processing is required. The amount of chemicals required for waste water processing is comparable to the amount of chemicals necessary for preparing the cleaning solution. The present invention produces a low concentration of ammonia and hydrogen peroxide discharge. It is of a water quality that requires only a small amount of acid for neutralization. Of course, the discharge is also of a quality that can be reused as source water. The hydrogen peroxide contained in the waste water is a trace amount. Normally, problems do not arise from these concentrations, but if necessary, the hydrogen peroxide dissolved in the waste water can be broken down as required. For example, water containing hydrogen peroxide can be brought into contact with catalysts such as platinum, palladium, manganese dioxide, or the like. In this way, the hydrogen peroxide is broken down into water and oxygen gas.

The present invention will be described in more detail in the following embodiments. The invention is not limited to these embodiments. For the embodiments and the comparative examples, ultrapure water was used in preparation of cleaning solution. The ultrapure water had a resistivity of 18 MΩ and 3 μg/l of total organic carbon.

Embodiment 1

A 6 inch diameter silicon wafer, which has had its surface oxidized by ultrapure water containing ozone, was contaminated with alumina particles. The contaminated wafer had alumina particles adhering to its surface. The number of particles adhered onto the contaminated wafer was measured using a wafer dust detection device, [WH-3 from Topcon Corporation, Tokyo, Japan], which is based on a laser scatter light detection principle. A single wafer had 12,600 particles 0.2–0.5 μm in diameter, 31,200 particles 0.5–1.0 μm in diameter, and 200 particles 1.0 μm or greater in diameter, for a total of 44,000 particles.

This contaminated wafer was rotated at 500 rpm. Cleaning solution, containing 30 mg/liter of dissolved oxygen, 10 mg/liter of ammonia, and 10 mg/liter of hydrogen peroxide, was poured at 800 ml/min. at room temperature while transmitting ultrasonic vibration using an ultrasonic shooting nozzle [Fine Jet T005J from Pre-Tech Co., Ltd., Fuchu, Tokyo, Japan] at a frequency of 1.6 MHz, and an output power of 13.5 W/cm$^2$. Spin cleaning was conducted for 60 seconds. The wafer was then rinsed using ultrapure water and dried.

After drying, the number of particles adhered onto the surface of the wafer was measured using the aforementioned wafer dust detection device. A single wafer had 130 particles 0.2–0.5 μm in diameter, 310 particles 0.5–1.0 μm in diameter, and 0 particles 1.0 μm or greater in diameter, for a total of 440 particles. The removal rate of particles from the wafer surface was 99%.

COMPARATIVE EXAMPLE 1

A silicon wafer was prepared and spin cleaned as in Embodiment 1. A cleaning solution containing oxygen gas dissolved at atmospheric saturation concentration, 10 mg/liter of ammonia, and 10 mg/liter of hydrogen peroxide, was used at room temperature. Cleaning of the wafer prepared in Comparative Example 1 was conducted in the same fashion as in Embodiment 1.

After drying, the number of particles adhered on the wafer surface was measured as in Embodiment 1. A single wafer had 6,400 particles of diameter 0.2–0.5 micrometer, 16,500 particles of diameter 0.5–1.0 micrometer, and 95 particles of diameter 1.0 micrometer or greater, for a total of 22,995 particles. The removal rate of the particles from the wafer surface was 48%.

COMPARATIVE EXAMPLE 2

A silicon wafer was prepared and spin cleaned as in Embodiment 1 except that no ultrasonic vibration was used and the cleaning was performed at 80° C. An AMP cleaning solution containing an atmospheric concentration of oxygen gas, 4.1 weight % of ammonia and 4.3 weight % of hydrogen peroxide was used. After drying, the number of particles adhered on the wafer surface was measured, as in Embodiment 1. A single wafer had 145 particles 0.2–0.5 μm in diameter, 340 particles 0.5–1.0 μm in diameter, and 1 particle 1.0 μm or greater in diameter, for a total of 486 particles. The removal rate of the particles from the wafer surface was 99%.

COMPARATIVE EXAMPLE 3

A silicon wafer was prepared and spin cleaned as in Embodiment 1 except cleaning was performed at 80° C. A ten-fold dilution of APM cleaning solution containing an atmospheric saturation concentration of oxygen, 4.1 weight % of ammonia and 4.3 weight % of hydrogen peroxide was used.

After drying, the number of particles adhered on the wafer surface was measured as in Embodiment 1. A single wafer had 3,440 particles 0.2–0.5 μm in diameter, 8,500 particles 0.5–1.0 μm in diameter, and 55 particles 1.0 μm or greater in diameter, for a total of 11,995 particles. The removal rate of the particles on the wafer surface was 73%.

Embodiment 2

A silicon wafer was prepared and spin cleaned as in Embodiment 1. A cleaning solution, containing 0.1 weight % of sodium hyposulfite, 10 mg/liter of ammonia, and 10 mg/liter of hydrogen peroxide was used.

After drying, the number of particles adhered onto the wafer surface was measured as in Embodiment 1. A single wafer had 120 particles 0.2–0.5 μm in diameter, 310 particles 0.5–1.0 μm in diameter, and 0 particles 1.0 μm or greater in diameter, for a total of 430 particles. The removal rate of the particles on the wafer surface was 99%.

Referring to Table 1, the cleaning solution composition of Embodiments 1–2, Comparative Examples 1–3, cleaning conditions, and the particle removal rates are shown.

TABLE 1

Particle Removal Rates

| | Cleaning Solution Composition | | | | | | Particle |
|---|---|---|---|---|---|---|---|
| | $O_2$ Gas | Sodium Hyposulfite | Ammonia | Hydrogen Peroxide | Temp. | Ultrasonic Vibration | Removal Rate (%) |
| Embodiment 1 | 30 mg/l | — | 10 mg/l | 10 mg/l | Room Temp. | Yes | 99 |
| Embodiment 2 | ASC* | 0.1 Weight % | 10 mg/l | 10 mg/l | Room Temp. | Yes | 99 |
| Comparative Example 1 | ASC* | — | 10 mg/l | 10 mg/l | Room Temp. | Yes | 48 |
| Comparative Example 2 | ASC* | — | 4.1 Weight % | 4.3 Weight % | 80° C. | No | 99 |
| Comparative Example 3 | ASC* | — | 0.41 Weight % | 0.43 Weight % | Room Temp. | Yes | 73 |

*ASC = Atmospheric Saturation Concentration (approximately 8 mg/liter $O_2$)

As can be seen from the results in Table 1, even though the cleaning solution of the present invention as shown in Embodiments 1 and 2 have 1/4000 of the content of ammonia and hydrogen peroxide compared with the APM cleaning solution of the prior art in Comparative Example 2, and despite the cleaning being done at room temperature, the present invention has particle removal rates similar to the prior art when cleaning a wafer contaminated by particles. The particle removal rate of Comparative Example 1 was halved when the cleaning solution had the same ammonia and hydrogen peroxide content as Embodiment 1 and 2, but oxygen gas was only dissolved at atmospheric saturation concentration and no reducing agent was used. The effectiveness of the cleaning solution of the present invention containing oxygen gas dissolved at a higher concentration than atmospheric saturation concentration, ammonia, and hydrogen peroxide is confirmed. The effectiveness of the cleaning solution of the present invention containing dissolved reducing agents, ammonia, and hydrogen peroxide is also confirmed. Furthermore, in the cleaning solution of Comparative Example 3, where the ammonia and hydrogen peroxide concentration was 1/10 of the concentration of APM cleaning solution of the prior art, the particle removal rate was only approximately 70%, even when ultrasonic vibrations were transmitted. In order for APM cleaning to be effective, a cleaning solution must contain a high concentration of chemicals and be used at an elevated temperature.

The cleaning solution of the present invention having a higher concentration of dissolved oxygen gas than atmospheric saturation concentration can have the same particle removal effect as the APM cleaning of the prior art. This is true, despite having substantially lower concentrations of ammonia and hydrogen peroxide as compared to the APM cleaning solution of the prior art. In addition, the cleaning solution of the present invention containing reducing agents can have the same particle removal effect as the APM cleaning of the prior art. This is true, despite having substantially lower concentrations of ammonia and hydrogen peroxide as compared to the APM cleaning solution of the prior art. The present invention may be used in conjunction with general devices of a mass production factory. Thus, there are no impediments to its application.

Having described preferred embodiments of the present invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method for making a cleaning solution for electronic materials, comprising:

dissolving oxygen gas into a source water to a concentration in excess of atmospheric saturation concentration;

adding from about 0.1 mg/liter to about 10,000 mg/liter of ammonia to said source water; and adding from about 0.1 mg/liter to about 10,000 mg/liter of hydrogen peroxide to said source water, to produce a cleaning solution.

2. The method according to claim 1, wherein said step of adding said dissolved oxygen gas includes, in sequential order:

deaerating said source water to reduce the degree of saturation of the dissolved gases in said source water; and dissolving oxygen gas into said deaerated source water.

3. The method according to claim 2, wherein said degree of saturation of said dissolved gas in said source water is reduced in an amount approximately equivalent to the amount of said oxygen gas to be dissolved into said source water.

4. A method for making a cleaning solution for electronic materials, comprising:

dissolving oxygen gas into a source water to a concentration in excess of atmospheric saturation concentration;

adding from about 0.1 mg/liter to about 10,000 mg/liter of ammonia to said source water;

adding from about 0.1 mg/liter to about 10,000 mg/liter of hydrogen peroxide to said source water, to produce a cleaning solution;

said step of adding said dissolved oxygen gas includes in sequential order:

deaerating said source water to reduce the degree of saturation of the dissolved gases in said source water;

dissolving oxygen gas into the deaerated source water; and wherein a gas permeable membrane module is used to perform said deaerating and said dissolving steps.

5. The method according to claim 4, wherein said gas permeable membrane module includes a first stage and a latter stage;

said first stage deaerates said source water using a vacuum membrane;

said latter stage dissolves oxygen gas into said deaerated source water.

6. A method for making a cleaning solution for electronic materials, comprising:

adding at least one reducing agent selected from the group consisting of a reducing gas, a hyposulfite, a sulfite, a hydrogen sulfite, a nitrite, a sulfide and an inorganic reducing agent, to a source water to a predetermined concentration from about 0.00005 weight percent to about 1 weight percent;

adding from about 0.1 mg/liter to about 10,000 mg/liter of ammonia to said source water; and adding from about 0.1 mg/liter to about 10,000 mg/liter of hydrogen peroxide to said source water, to produce a cleaning solution.

7. The method according to claim 6, wherein said reducing agent is from about 0.05 weight percent to about 0.5 weight percent.

* * * * *